(12) United States Patent
McClure et al.

(10) Patent No.: US 6,717,425 B2
(45) Date of Patent: Apr. 6, 2004

(54) HIGH-DENSITY PCB TEST JACK

(75) Inventors: Linden H. McClure, Milliken, CO (US); Scott P. Allan, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 260 days.

(21) Appl. No.: 09/982,430

(22) Filed: Oct. 17, 2001

(65) Prior Publication Data

US 2003/0071643 A1 Apr. 17, 2003

(51) Int. Cl.[7] .................. G01R 31/02; H05K 1/00; H01R 4/02
(52) U.S. Cl. .................. 324/761; 439/63; 439/876
(58) Field of Search .................. 324/754, 755, 324/757, 758, 761, 762; 439/63, 83, 581, 876

(56) References Cited

U.S. PATENT DOCUMENTS 5,548,223 A * 8/1996 Cole et al. .................. 324/754
5,653,601 A * 8/1997 Martucci et al. ............ 439/82
6,019,616 A * 2/2000 Yagi et al. .................. 439/108
6,273,759 B1 * 8/2001 Perino et al. ................ 439/631
6,442,832 B1 * 9/2002 Noble ......................... 29/854

OTHER PUBLICATIONS

Chrzanowski et al, "Surface–Connected Connector," IBM Technical Disclosure Bulletin, vol. 21, No. 12, May 1979, p. 4508.*
Data Sheet, Johnson Components, (2001) (Month Unavailable).

* cited by examiner

*Primary Examiner*—Evan Pert
*Assistant Examiner*—Russell M. Kobert

(57) ABSTRACT

A printed-circuit board (PCB) test jack comprises a body portion adapted for mounting on the top surface of a PCB and to provide mechanical support and signal and ground connections to an external test probe. At least one surface mount ground conductor is connected to and extends from the body portion to provide the ground connection; the ground conductors are arrayed for attaching to corresponding surface pads on the PCB's top surface. A single through-hole pin for insertion into a corresponding through-hole on the PCB is electrically isolated from the surface mount ground conductors and is connected to the body portion for providing the signal connection.

16 Claims, 2 Drawing Sheets

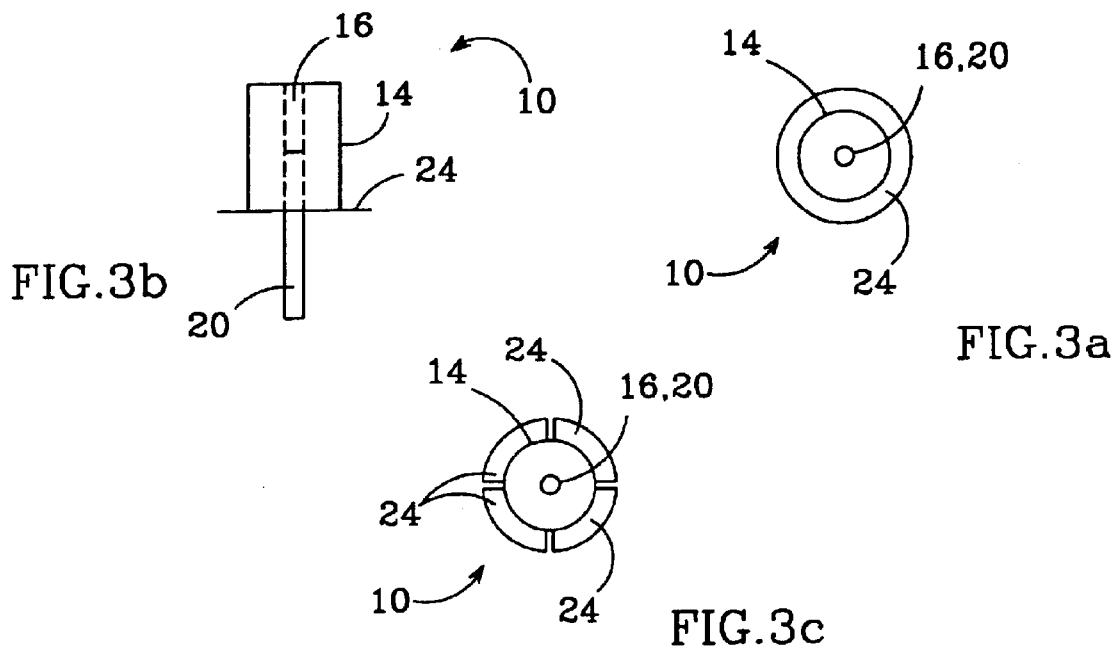
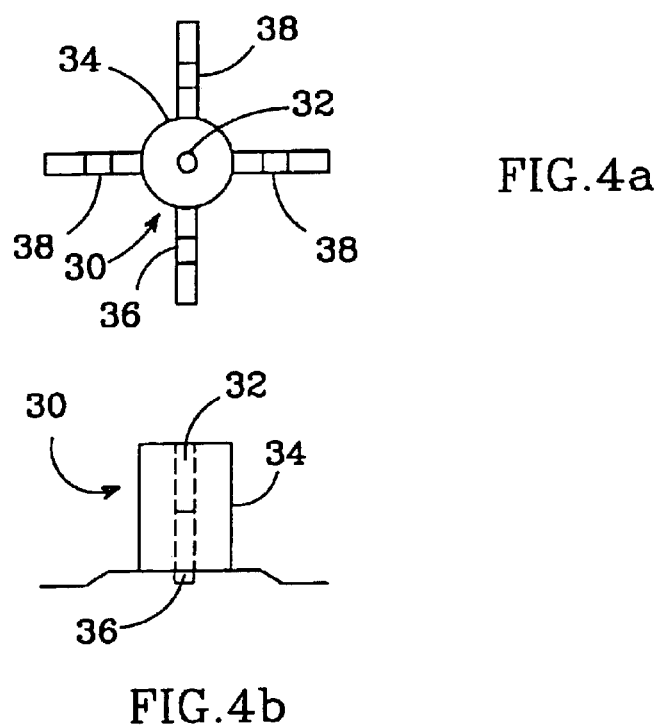

HIGH-DENSITY PCB TEST JACK

BACKGROUND OF THE INVENTION

1. Field of the Invention

This invention relates to the field of printed circuit board (PCB) test jacks, and particularly to test jacks for use on high-density PCBs.

2. Description of the Related Art

Printed circuit boards (PCBs) are often tested using a test probe which contacts a signal trace of interest. In some instances, test jacks are mounted onto the PCB to facilitate such testing. To provide signal and ground connections to the test probe, the test jack typically employs two or more through-hole pins that are inserted into through-holes on the PCB. These through-holes are bored all the way through the PCB, where they pass through signal and ground traces as necessary to effect a desired measurement. The through-hole pins of the test jack are soldered into their respective holes, thereby securing the jack to the PCB and providing the electrical connections.

However, when a PCB is a multi-layer board carrying a high-density of signal traces, each of the two or more through-holes required by the test jack can interfere with the routing of signals on the top and inner layers of the board. In addition, the many signal traces can force the through-holes to be located some distance away from their respective sources, which can adversely affect the quality of the probed signal.

SUMMARY OF THE INVENTION

The present test jack comprises a body portion arranged to interface with an external test probe, at least one surface mount conductor connected to the body portion and arrayed for attaching to corresponding surface pads on the surface of a PCB, and a signal conductor connected to the body portion. The signal conductor comprises a single through-hole pin for insertion into a corresponding single through-hole on the PCB. Using only a single through-hole pin reduces signal routing interference in the PCB when compared with a test jack employing multiple through-hole pins.

Alternatively, a test jack in accordance with the present invention may employ no through-hole pins. In this case, the signal conductor is also a surface mount-type, which is connected to the body portion and arrayed for attaching to a corresponding surface pad on the surface of a PCB.

BRIEF DESCRIPTION OF THE DRAWINGS

Further features and advantages of the invention will be apparent to those skilled in the art from the following detailed description, taken together with the accompanying drawings:

FIG. 1b is a side elevation view of the test jack shown in FIG. 1a.

FIG. 3a is a plan view of another possible embodiment of a test jack per the present invention.

FIG. 3b is a side elevation view of the test jack shown in FIG. 3a.

FIG. 3c is a plan view of another possible embodiment of a test jack per the present invention.

FIG. 4a is a plan view of another possible embodiment of a test jack per the present invention.

FIG. 4b is a side elevation view of the test jack shown in FIG. 4a.

DETAILED DESCRIPTION OF THE INVENTION

Figure 1A:
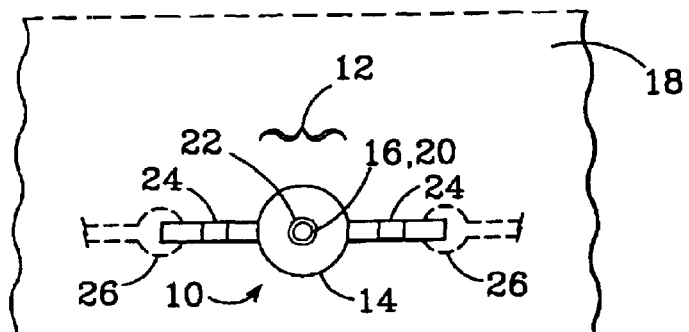
FIG. 1a is a plan view of a test jack per the present invention.

A PCB test jack in accordance with the present invention is shown in FIGS. 1a (plan view) and 1b (side elevation view). The test jack 10 comprises a body portion 12, preferably cylindrical, which provides a mechanical and electrical interface to a test probe (not shown). The test jack body typically provides two connections for a test probe: a ground or shield connection 14, and a "signal" connection 16 which conveys a signal of interest. A test probe suitable for use with test jack 10, such as an oscilloscope probe, is designed to make contact with the jack's ground and signal connections when inserted into the jack body. Note that, although connection 14 is referred to herein as a "ground" connection, it may carry other, non-ground signals instead.

To provide a connection to a signal of interest, test jack 10 is mounted on a printed-circuit board (PCB) 18. To facilitate the mounting, test jack 10 includes a signal conductor that preferably comprises a single through-hole pin 20; through-hole pin 20 fits into a corresponding through-hole 22 bored through PCB 18. An electrical connection 23 is effected between through-hole pin 20 and signal connection 16 within the body 12 of the test jack. Through-hole 22, which is typically a plated-through hole, is positioned such that it passes through a signal trace which carries the signal of interest; the signal trace may be located on the top, bottom, or an inner layer of PCB 18. Through-hole pin 20 is soldered into through-hole 22, such that an electrical connection is provided between the signal of interest and pin 20 (and thus signal connection 16). Soldering pin 20 into hole 22 also firmly affixes test jack 10 to PCB 18, providing mechanical strength to the mounting. Through-hole pin 20 can be soldered into through-hole 22 using, for example, a wave soldering machine or by hand.

To provide a connection to an appropriate ground or shield (or other, non-ground signal) trace, test jack 10 includes at least one surface mount conductor 24, which extends generally perpendicularly from the jack's body 12 and is affixed to a corresponding surface pad 26 on the surface of PCB 18. The surface pads can be connected to inner PCB layers using vias, which can be more flexibly located on the PCB and thus minimize interference with signals routed on the inner layers. The PCB preferably comprises surface pads that align with the test jack's surface mount conductors 24 when the jack's through-hole pin 20 is installed into through-hole 22. When so installed, surface mount conductors 24 are soldered to their corresponding surface pads. This may be accomplished by, for example, using solder paste to lightly "glue" the conductors to their corresponding pads, and then passing the PCB through a solder reflow machine to melt the solder paste and form a permanent connection between the conductors and the PCB.

Providing a test jack with just a single through-hole pin reduces the degree to which signal routing on and within the PCB is interfered with by the presence of the jack. This is especially important with high-density PCBs, which typically include at least 4 layers and have a large number of closely-spaced signal traces on each layer. Test jacks which each require multiple through-holes can severely impact signal routing within this type of board.

Figure 1B:
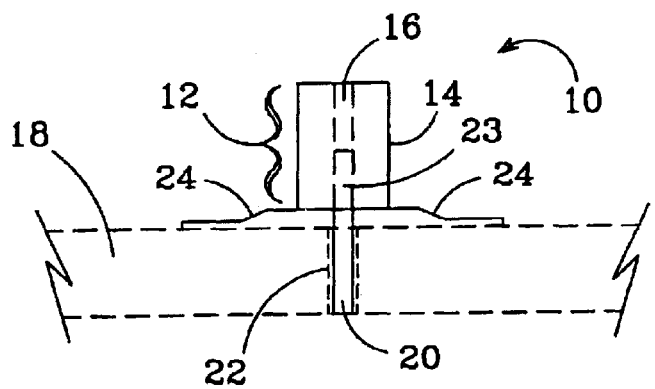
Figures 2A, 2B, 2C:
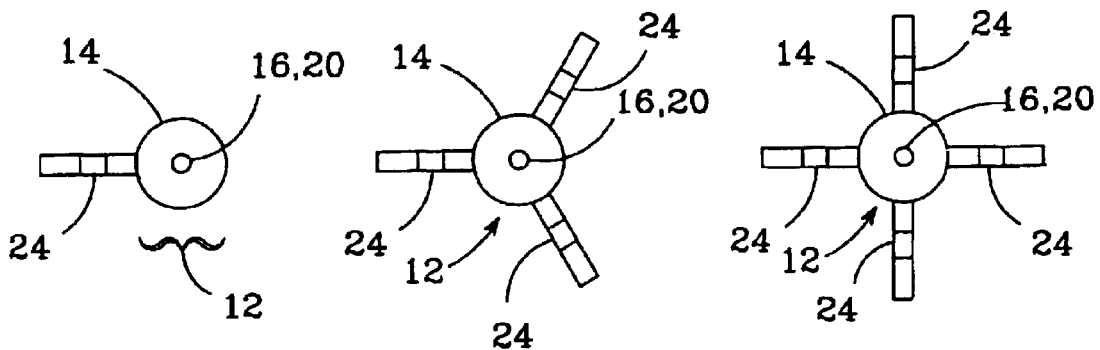
FIGS. 2a–2c are plan views of alternate embodiments of the present test jack.

The present PCB test jack requires at least one surface mount conductor 24. The jack in FIGS. 1a and 1b depict the use of two such conductors, equally-spaced 180° apart around the jack body. Other possible arrangements are shown in the plan views of FIGS. 2a, 2b and 2c. FIG. 2a shows the use of a single surface mount conductor 24, FIG. 2b shows the use of three surface mount conductors 24, equally spaced 120° apart, and FIG. 2c shows four conductors 24, spaced 90° apart. The number and arrangement of surface mount conductors 24 is preferably application-specific: if the test jack's mounting requires a high degree of mechanical strength, a greater number of surface mount conductors can be employed. On the other hand, if interference with signal routing on the top surface of the PCB is a primary concern, a lesser number of surface mount conductors can be used.

Another option for surface mount conductors 24 is shown in FIGS. 3a (plan view) and 3b (side elevation view). Here, surface mount conductor 24 is ring-shaped, encircling and extending perpendicularly from the body 12 of test jack 10. The PCB to which this type of test jack would be mounted would include a corresponding ring-shaped surface pad, to which the surface mount conductor would be soldered.

An alternative embodiment of the ring-shaped surface mount conductor shown in FIGS. 3a and 3b is shown in the plan view of FIG. 3c. Here, the conductor includes thermal reliefs, i.e., small separations in the metal, periodically spaced around the ring. The thermal reliefs serve to keep heat applied to one part of the contact localized in that area, thereby improving the ability to melt solder.

Though the use of a single through-hole pin is preferred, this is not essential to the invention, which also contemplates a test jack having no through-hole pins. Such a jack is shown in FIGS. 4a (plan view) and 4b (side elevation view). As before, the jack includes a body portion 30 which includes a signal connection 32 and a ground connection 34 for interfacing to an external test probe. Here, however, rather than connect signal connection 32 to the PCB using a through-hole pin, a surface mount conductor 36 is used. Ground connection 34 is connected to the PCB using one or more surface mount conductors 38, as described above. In this way, both the test jack's signal and ground connections are effected using surface mount conductors, which are soldered to corresponding surface pads on the PCB surface. As a result, disruption of signal routing on the inner board layers due to through-holes is further reduced. Note, however, that if more mechanical strength is needed, to perform long term or repetitive test measurements, for example, a test jack using a single through-hole pin as described above is preferred.

We claim:

1. A printed-circuit board (PCB) test jack, comprising:
   a body portion adapted for mounting on the top surface of a PCB and to provide mechanical support and an electrical interface to an external test probe inserted into said body portion,
   at least one surface pad on said PCB's top surface,
   at least one surface mount conductor connected to said body portion and arrayed for attaching to corresponding ones of said surface pads on said PCB's top surface
   a through-hole in said PCB, and
   a signal conductor electrically isolated from said at least one surface mount conductor and connected to said body portion for providing a signal connection to said external test probe, comprising a single conductive through-hole pin for insertion into said through-hole in said PCB.

2. The test jack of claim 1, wherein said body portion is cylindrical and said at least one surface mount conductor comprises one surface mount conductor which extends approximately perpendicularly from said body portion.

3. The test jack of claim 1, wherein said body portion is cylindrical and said at least one surface mount conductor comprises two surface mount conductors which extend approximately perpendicularly from opposite sides of said body portion such that said surface mount conductors are 180° apart.

4. The test jack of claim 1, wherein said body portion is cylindrical and said at least one surface mount conductor comprises three surface mount conductors which extend approximately perpendicularly from said body portion such that said surface mount conductors are 120° apart.

5. The test jack of claim 1, wherein said body portion is cylindrical and said at least one surface mount conductor comprises four surface mount conductors which extend approximately perpendicularly from said body portion such that said surface mount conductors are 90° apart.

6. The test jack of claim 1, wherein said body portion is cylindrical and said at least one surface mount conductor comprises a ring-shaped conductor which encircles and extends approximately perpendicularly from said body portion.

7. The test jack of claim 6, wherein said ring-shaped conductor comprises at least two thermal reliefs spaced periodically around said body portion.

8. The test jack of claim 1, wherein said PCB further comprises an inner ground plane layer and vias from said corresponding surface pads to said inner ground plane layer.

9. The test jack of claim 1, wherein said PCB is a high-density multi-layer PCB.

10. The test jack of claim 1, further comprising a PCB to which a plurality of said PCB test jacks are to be mounted, said PCB including corresponding surface pads and through-holes for mounting each of said PCB test jacks.

11. The test jack of claim 1, wherein said body portion comprises a signal connection which interfaces with said external test probe and which is electrically connected to said single through-hole pin, and a ground connection which interfaces with said external test probe and which is electrically connected to said at least one surface mount conductor.

12. A printed-circuit board (PCB) test jack, comprising:
   a body portion adapted for mounting on the top surface of a PCB and to provide mechanical support and signal and ground connections to an external test probe,
   at least one surface pad on said PCB's top surface,
   at least one surface mount ground conductor that extends from said body portion and is connected to said body portion for providing said ground connection, said surface mount ground conductors arrayed for attaching to corresponding ones of said surface pads on said PCB's top surface
   a through-hole in said PCB, and
   a signal conductor electrically isolated from said at least one surface mount ground conductor and connected to said body portion for providing said signal connection, comprising a single conductive through-hole pin for insertion into a said through-hole in said PCB.

13. The test jack of claim 12, wherein said at least one surface mount ground conductor extends approximately perpendicularly from said body portion.

14. The test jack of claim 12, wherein said PCB further comprises an inner ground plane layer and vias from said corresponding surface pads to said inner ground plane layer.

15. The test jack of claim 12, wherein said PCB is a high-density multi-layer PCB.

16. The test jack of claim 12, further comprising a PCB to which a plurality of said PCR test jacks are to be mounted, said PCB including corresponding surface pads and through-holes for mounting each of said PCB test jacks.

* * * * *